United States Patent
Vu

(10) Patent No.: US 7,305,601 B2
(45) Date of Patent: Dec. 4, 2007

(54) METHOD AND TEST APPARATUS FOR TESTING INTEGRATED CIRCUITS USING BOTH VALID AND INVALID TEST DATA

(75) Inventor: Chris D. Vu, Santa Clara, CA (US)

(73) Assignee: LSI Corporation, Milpitas, CA (US)

( * ) Notice: Subject to any disclaimer, the term of this patent is extended or adjusted under 35 U.S.C. 154(b) by 270 days.

(21) Appl. No.: 10/992,389

(22) Filed: Nov. 17, 2004

(65) Prior Publication Data

US 2006/0123294 A1    Jun. 8, 2006

(51) Int. Cl.
*G01R 31/28* (2006.01)
(52) U.S. Cl. ..................................... 714/726
(58) Field of Classification Search ............... 714/724, 714/726, 727, 736, 740, 742
See application file for complete search history.

(56) References Cited

U.S. PATENT DOCUMENTS 5,996,102 A * 11/1999 Haulin .................... 714/740
2002/0170011 A1 * 11/2002 Lai et al. .................. 714/727

OTHER PUBLICATIONS

Avantest, "*T6673 SOC Test System*," Jun. 2001, Avantest America Inc., 2 Pages.

Avantest Japan, "*T6673 SOC Test System*," downloaded from http://www.advantest.co.jp/products/ate/t6673/en-index.shtml, Nov. 18, 2004, 2 Pages.

Avantest Japan, "*T6683 SOC Test System*," downloaded from http://www.advantest.co.jp/products/ate/t6683/en-index.shtml, Nov. 18, 2004, 2 Pages.

IEEE Standard Test Access Port and Boundary-Scan Architecture (IEEE Std. 1149.1-2001).

IEEE Standard for Boundary-Scan Testing of Advanced Digital Networks (IEEE Std. 1149.6-2003).

* cited by examiner

*Primary Examiner*—James C. Kerveros
(74) *Attorney, Agent, or Firm*—Beyer Weaver LLP

(57) ABSTRACT

A simplified boundary scan test method capable of performing boundary test scanning of semiconductor chips. The test method includes providing valid test data to a first terminal of the semiconductor device and purposely providing invalid test data to a second terminal of the semiconductor device in a predetermined pattern algorithm. Preload data is also preloaded onto the semiconductor device. The valid and invalid test data is then captured in the semiconductor device. If the captured data is as expected, it signifies that there is no problem with the boundary scan circuitry on the device. On the other hand if the captured data differs from what is expected, it signifies that there may be a problem with the boundary scan circuitry.

15 Claims, 2 Drawing Sheets

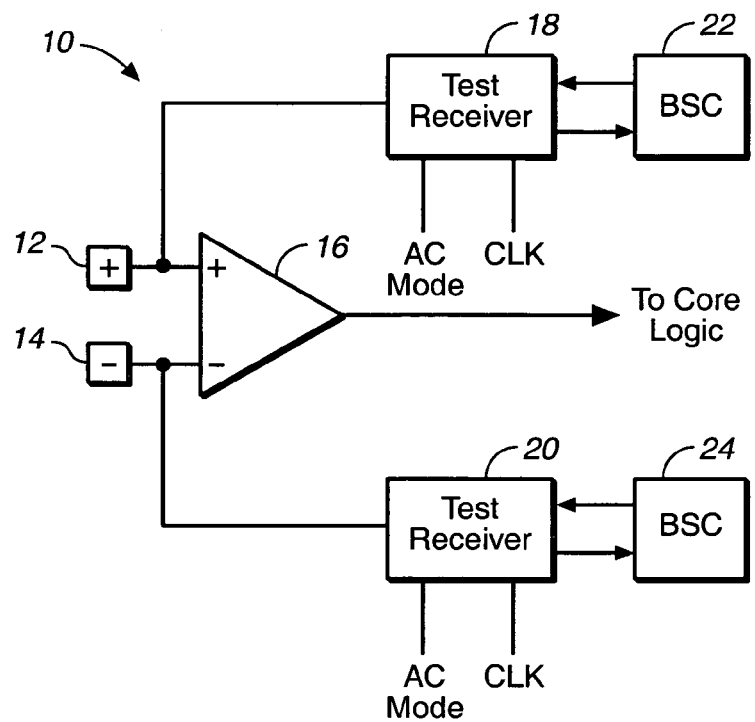
FIG._1
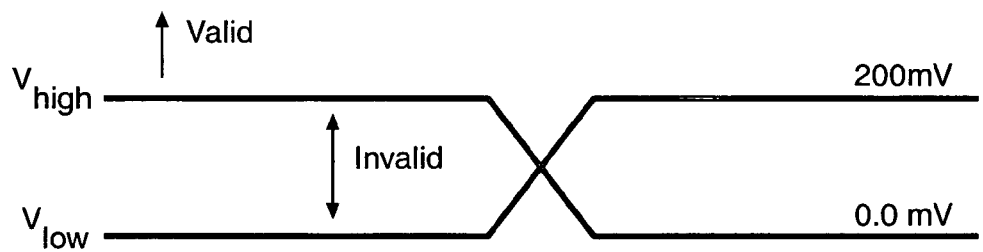
FIG._3A
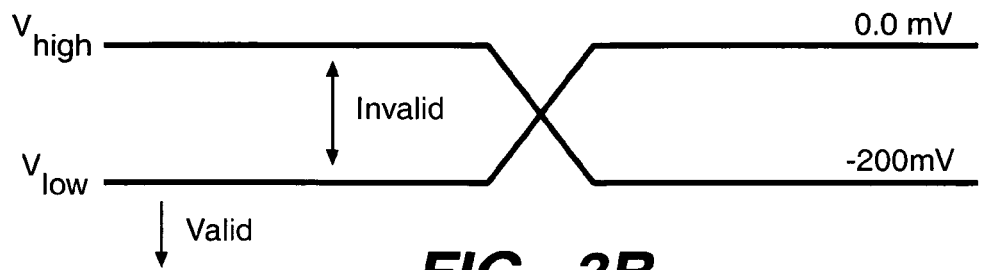
FIG._3B

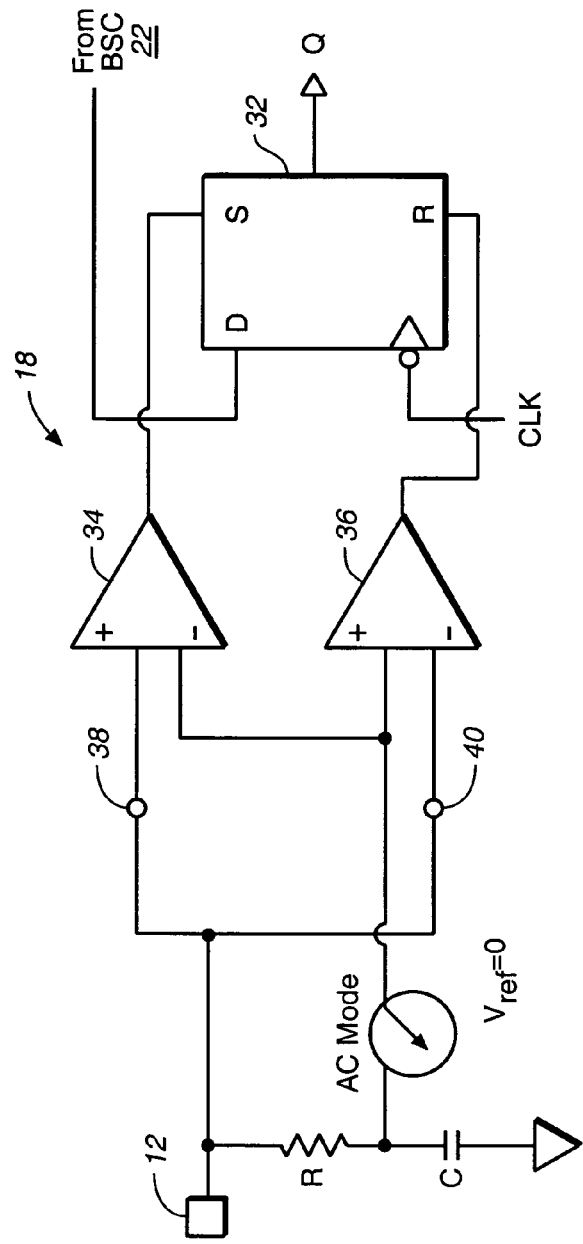
FIG._2A
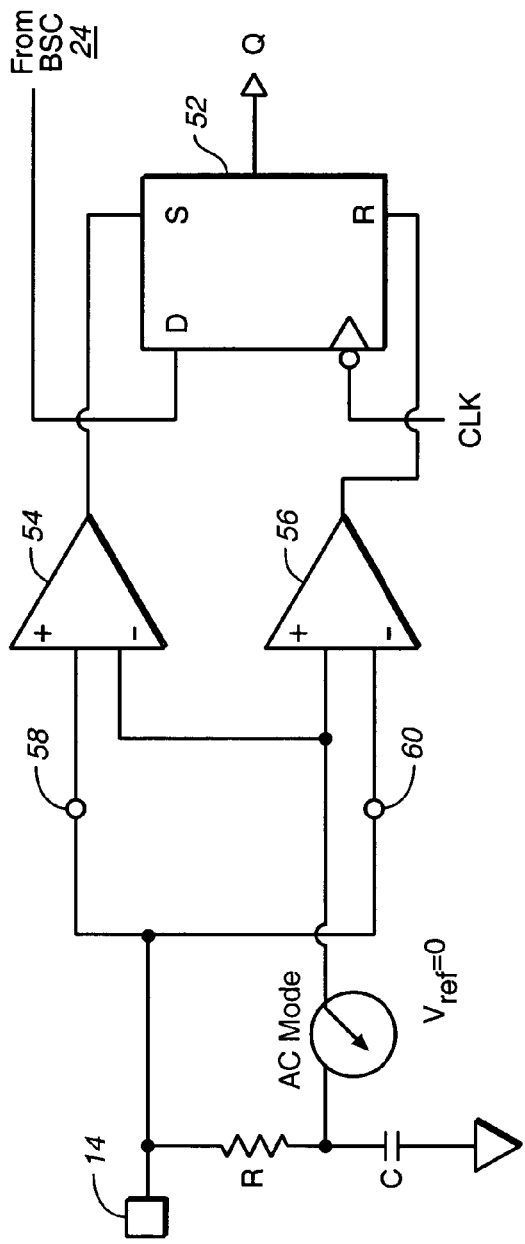
FIG._2B

METHOD AND TEST APPARATUS FOR TESTING INTEGRATED CIRCUITS USING BOTH VALID AND INVALID TEST DATA

BACKGROUND OF THE INVENTION

1. Field of the Invention

The present invention relates generally to the testing of semiconductor circuits, and more particularly, to the testing of integrated circuits by using a known pattern algorithm of defined voltage level values for both valid and invalid test data to robustly test screen and screen out manufacturing defects of the IEEE 1149.6 boundary scan circuitry on semiconductor chips.

2. Description of the Related Art

After an integrated circuit is fabricated, it will undergo electrical testing to determine if the chip operates properly or is defective. Typically the chip is placed onto a test board and electrically coupled to a testing machine. A known sequence of input data signals are then applied to input pins of the chip. In reply, the chip will process the input data signals and generate data output signals. The data output signals are then analyzed. If the state of the output signals are as expected, it indicates that the chip is operating properly. On the other hand, if the data output signals differ from the expected result, it likely means the chip is defective or there is a problem of some kind. The problem could be either with the integrity of the signal received by the chip and/or the path between the input pin where the test signal is received and the test circuitry on the chip.

Boundary Scan testing is a widely used standard in the semiconductor industry for testing the input-output circuitry on semiconductor chips. IEEE standard 1149.1 provides the specification for the boundary scan testing of digital signals, whereas IEEE 1149.6 defines the standard for analog signals. With either digital or analog devices, the IEEE standard operates essentially the same. A known sequence of input signals defined by the standard is provided to the input pins of the chip. Test receiver circuitry on the chip processes the input signals and provides data output signals to boundary scan circuitry on the chip. Again, if the output data signals are the same as the expected data signals, it is assumed the chip is operational. If output data signals are different, it is assumed that there was a problem with the integrity of the input signals and/or the path from the chip input pin to the test receiving circuitry. For more details on the digital and analog boundary scan IEEE standards, see *IEEE Standard Test Access Port and Boundary-Scan Architecture* (IEEE Std. 1149.1-2001) and *IEEE Standard for Boundary-Scan Testing of Advanced Digital Networks* (IEEE Std. 1149.6-2003), both incorporated by reference herein for all purposes.

The problem with the aforementioned boundary scan testing standard is that a separate boundary scan piece of test equipment is required to test the chips. These test machines tend to be very expensive. In some cases, the test head used to receive the chip has to be customized for each type of chip. This customization further adds to the cost of using a boundary scan test device.

Accordingly, there is a need for a simplified boundary scan test method and test apparatus capable of performing boundary test scanning of semiconductor chips in a production test environment without the need of expensive dedicated automated test equipment.

SUMMARY OF THE INVENTION

The present invention relates to a simplified boundary scan test method capable of performing boundary test scanning of semiconductor chips without the need of an expensive, dedicated automated piece of test equipment. The test method comprises providing defined valid test data to a first terminal of the semiconductor device and purposely providing defined invalid test data to a second terminal of the semiconductor device in a predetermined pattern algorithm. Preload data is also preloaded onto the semiconductor device. The valid and invalid test data is then captured in the semiconductor device. If the captured data is as expected, it signifies that there is no problem with the boundary scan circuitry on the device. On the other hand if the captured data differs from what is expected, it signifies that there may be a problem with the boundary scan circuitry.

BRIEF DESCRIPTION OF THE DRAWINGS

The invention, together with further advantages thereof, may best be understood by reference to the following description taken in conjunction with the accompanying drawings in which:

FIG. 1 is a block diagram of a differential input used for boundary scan testing;

FIG. 2 is a circuit diagram of an exemplary test receiver used in the block diagram of a differential input used for boundary scan testing.

FIG. 3 is a signal diagram illustrating valid and invalid data input signals; and In the figures, like reference numbers refer to like components and elements.

DETAILED DESCRIPTION OF THE INVENTION

Referring to FIG. 1, a block diagram of a differential input used for boundary scan testing is shown. The differential input circuit 10 includes a pair of differential input pins 12 and 14, a differential receiver 16, and a pair of test receiver circuits 18 and 20. The input pins 12 and 14 are coupled to the positive and negative inputs of the differential receiver 16 and the test receiver circuits 18 and 20 respectively. A pair of boundary scan circuits (BSCs) 22 and 24 are also coupled to the pair of test receiver circuits 18 and 20 respectively. According to various embodiments, the differential input can be configured to receive either digital or analog signals. For the sake of simplicity, the operation of the differential input circuit 10 is initially described with respect to digital signals.

During operation, a pair of differential digital signals are applied to the pins 12 and 14 respectively. In response, the differential receiver "differentiates" between the input signals and provides the original signal to the core circuitry on the chip. For example, if the signal at pin 12 is high and low on pin 14, then a high logic signal is provided to the core circuitry on the chip by the differential receiver 16. Alternatively, a low logic signal is provided to the core circuitry when the signal applied to pin 12 is low and high to pin 14.

The test receiver circuits 18 and 20 are provided to implement the boundary scan testing on the input signals received at pins 12 and 14 respectively. The BSCs provide a known pattern of test signals to the test receiver circuits 18 and 20 respectively. The test receiver circuits 18 and 20 compare the captured differential signals received on pins 12 and 14 with known pattern of test data respectively. If the captured data provided back to the BSCs 22 and 24 are as expected, meaning it matches the known test pattern of data, it indicates the input circuitry is operating properly. On the other hand if the captured signals are different, it indicates that there is a problem of some kind, either with the integrity of the input signals and/or the path from the chip input pin to the test.

Referring to FIG. 2A, a circuit diagram of an exemplary test receiver 18 is shown. The test receiver 18 includes an S-R type flip-flop 32, a pair of comparators 34 and 36, a pair of offset circuits 38 and 40, a resistor R and a capacitor C. A signal from the pin 12 is provided to the positive input (+) of comparator 34 and the negative input (−) of comparator 36 through offset circuits 38 and 40 respectively. Vref is applied to the negative input (−) of comparator 34 and the positive input (+) of comparator 36. The output of comparator 34 is coupled to the S input of the flip-flop 32. The output of comparator 36 is coupled to the R input of flip-flop 32. The D input is coupled to the BSC 22. Vref is set to zero volts (Vref=0.0).

Referring to FIG. 2B, a circuit diagram of an exemplary test receiver 20 is shown. The test receiver 20 includes an S-R type flip-flop 52, a pair of comparators 54 and 56, a pair of offset circuits 58 and 60, a resistor R and a capacitor C. A signal from the pin 14 is provided to the positive input (+) of comparator 54 and the negative input (−) of comparator 56 through offset circuits 58 and 60 respectively. Vref is applied to the negative input (−) of comparator 54 and the positive input (+) of comparator 56. The output of comparator 54 is coupled to the S input of the flip-flop 52. The output of comparator 56 is coupled to the R input of flip-flop 52. The D input is coupled to the BSC 24. Vref is set to zero volts (Vref=0.0).

Referring to FIG. 3A, a differential signal diagram illustrating both valid 1 and invalid 0 data input signal values is shown when testing for a valid 1. As illustrated in the waveform, any signal having a voltage equal to or greater than $V_{high}$ (200 mV) is considered a valid high (H) signal. Any signal having a voltage equal to 0 V and less than $V_{high}$ is considered a invalid low (L) signal.

Referring to FIG. 3B, a differential signal diagram illustrating both valid 0 and invalid 1 data input signal values is shown when testing for a valid 0. As illustrated in the waveform, any signal having a voltage equal to or less than $V_{low}$ (−200 mV) is considered a valid low (L) signal. Any signal having a voltage equal to 0 V and greater than $V_{low}$ is considered a invalid high (H) signal.

When testing for a valid logic one, a logic high (H) signal with its voltage value equal to or greater than that defined as a valid high signal in FIG. 3A is provided to pin 12 and a logic low (L) signal is preloaded to the D input of flip flop 32 from BSC 22. Under these conditions, comparator 34 is active, resulting in triggering the S input of flip-flop 32. As a result, the flip-flop 32 is toggled, resulting in a logic (H) signal at the Q output. The logic (H) is then captured back into BSC 22, thus verifying a valid one signal at pin 12.

Simultaneously, a logic (L) signal with its voltage value equal to or less than that defined as an invalid low is provide to pin 14 while the BSC 24 preloads a logic (H) signal to the D input of flip-flop 52. The low voltage of the logic (L) signal at pin 14 will not activate neither the upper comparator 54 nor the lower comparator 56. As a result, the preloaded signal in the D input of the flip-flop would be captured back in the BSC 24 upon the next clock transition, thus verifying an invalid 0 on pin 14.

If captured input signal data in the BSC circuits 22 and 24 matches the expected data compared at TDO (test data output of the BSC chain), then it is assumed that the device is operating properly. On the other hand, if the captured data differs from the expected data, then it is assumed that a problem exists Testing for a valid logic zero is essentially the complement of what is described above with a logic low (L) signal with its voltage value equal to or less than that defined as a valid 0 in FIG. 3B. A detailed description is therefore not provided herein.

Table I is a truth table that summarizes the logic states for the Pins 12, 14, inputs from the BSC circuits 22, 24 and the expected outputs.

TABLE I

| Test | Input Pin | Data Input | Preload from BSC | Capture |
|------|-----------|------------|------------------|---------|
| Logic L/ | 12 | H | L | H |
| Logic H | 14 | L | H | L |
|  | 12 | L | H | L |
|  | 14 | H | L | H |

It should be noted that test receivers 18 and 20 can also operate in an analog mode. Each receiver includes an AC mode switch. When set to the analog mode, Vref is coupled between the resistor R and capacitor C. Vref is therefore set at a voltage between that of the input pin (either 12 or 14) and ground. The operation of test receivers 18 and 20 are essentially the same as in the digital mode. If the analog signal received at the input pin is greater than Vref, than the S input to the flip flop will be high and the R input will be low. If the input signal voltage is less than Vref, then the S input is low and the R input is high.

The present invention relates to a method of performing boundary scan testing by purposely providing a known patterned algorithm of both valid and invalid test data to the chip and determining if there is a problem by comparing the captured data with the data expected to be captured. In other words, the method involves using the defined voltage level values of Valid and Invalid data as well as the sequence of pattern algorithm to robustly test and screen out manufacturing defects of the 1149 circuitry paths with the use of an Automated Test Equipment (ATE) logic analyzer.

Table 2 defines a pattern algorithm used to implement boundary scan testing according to the present invention.

TABLE 2

Pattern Algorithm

| Pattern | Input Pin | Data Input | Preload from BSC | Capture | Limits |
|---------|-----------|------------|------------------|---------|--------|
| Valid 1 | 12 | Valid 1 | 0 | H | Vih = 200 mV |
|  | 14 | Invalid 0 | 1 | H | Vil = 0 mV |
|  | 12 | Invalid 0 | 1 | H |  |
|  | 14 | Valid 1 | 0 | H |  |
| Valid 0 | 12 | Valid 0 | 1 | L | Vih = 0 mV |
|  | 14 | Invalid 1 | 0 | L | Vil = −200 mV |
|  | 12 | Invalid 1 | 0 | L |  |
|  | 14 | Valid 0 | 1 | L |  |

Table 2 as interpreted as follows. For testing a valid logic 1, a valid 1 is provided to input pin 12 and an invalid 0 is provided to input pin 14. The BSC 22 and 24 preload a (0) and (1) to the D inputs of flip-flops 32 and 52 of receivers 18 and 20 respectively. The valid 1 at the input pin 12 triggers comparator 34 and provides a logic (1) signal to the Set input of flip-flop 32. The flip-flop 32 is thus toggled, resulting in a logic (H) at the Q output. The invalid (0), however, fails to trigger comparator 56 or Reset the flip-flop 52. As a consequence, the Q output of flip-flop 52 is a logic (H). For the next data sequence, an invalid (0) and a valid (1) are provided to the pins 12 and 14. Logic (1) and logic (0) are preloaded from the BSCs 22 and 24 into flip-flops 32 and 52, respectively. The circuit is presumed to be operating properly if a logic (H) and (H) are captured into BSC 22 and 24 from the Q outputs of flip-flops 32 and 52, respectively. The next data sequence is to verify the opposite polarity signals at the pins 12 and 14. Valid logic low (0) is applied to pin 12 and invalid logic high (1) is applied to pin 14. If logic low (L) is captured at both Q outputs, then the circuit is operating properly. Finally, an invalid (1) and a valid (0) are applied to pins 12 and 14 respectively. If a logic (L) is captured at both Q outputs, then the circuit is operating properly. If, however, the captured data differs from the expected captured data in Table 2, then it signifies a problem with the signal paths of the boundary scan circuitry.

Although the foregoing invention has been described in some detail for purposes of clarity of understanding, it will be apparent that certain changes and modifications may be practiced within the scope of the appended claims. For example, the substrate 14 and described herein can be made of a number of different materials, such as ceramic or plastic. The substrate 14 can also be a lead frame made of a metal such as copper. In embodiments where the substrate 16 is a lead frame, the die 12 is attached to the die attach pad and the contact pads 22 are leads of the lead frame. Therefore, the described embodiments should be taken as illustrative and not restrictive, and the invention should not be limited to the details given herein but should be defined by the following claims and their full scope of equivalents.

I claim:

1. A method of performing boundary scan testing of a semiconductor device, the method comprising:
   providing valid test data to a first terminal of the semiconductor device, wherein the valid test data comprises data signals at or above a predetermined positive voltage level or at or below a predetermined negative voltage level;
   purposely providing invalid test data to a second terminal of the semiconductor device, wherein the invalid test data comprises data signals between the positive and the negative voltage levels,;
   preloading preload data to the semiconductor device;
   capturing the valid test data within the semiconductor device;
   capturing the invalid test data within the semiconductor device; and
   determining if there is a boundary scan problem by comparing the captured valid test data and the invalid test data with a predetermined sequence of expected test data.

2. The method of claim 1, wherein the valid test data has a first defined voltage level.

3. The method of claim 2, wherein the positive and negative defined voltage levels are +/−200 mVolts respectively.

4. The method of claim 1, wherein the invalid test data has a second defined voltage level.

5. The method of claim 4, wherein the second defined voltage level is approximately 0.0 mVolts.

6. The method of claim 1, wherein the valid test data and the invalid test data are provided to the semiconductor device in a predetermined sequence.

7. The method of claim 6, wherein the predetermined sequence for testing for a logic high (H) signal comprises:
   providing a valid logic high (H) signal to the first terminal; and
   providing an invalid logic low (L) signal to the second terminal.

8. The method of claim 7, wherein the predetermined sequence for testing for a logic high (H) signal further comprises:
   providing an invalid logic low (L) to the first terminal; and
   providing a valid logic high (H) to the second terminal.

9. The method of claim 8, further comprising determining there is no boundary scan problem if the following sequence high (H), high (H), high (H) and high (H) is captured in response to the valid logic high (H), the invalid logic low (L), the invalid logic low (L), and the valid (H) sequence provided to the first terminal the second terminal respectively.

10. The method of claim 6, wherein the predetermined sequence for testing for a logic low (L) signal comprises:
    providing a valid logic low (L) signal to the first terminal; and
    providing an invalid logic high (H) signal to the second terminal.

11. The method of claim 10, wherein the predetermined sequence for testing for a logic low (L) signal further comprises:
    providing an invalid logic high (H) to the first terminal; and
    providing a valid logic low (L) to the second terminal.

12. The method of claim 11, further comprising determining there is no boundary scan problem if the following sequence low (L), low (L), low (L) and low (L) is captured in response to the valid logic low (L), the invalid logic high (H), the invalid logic low (H), and the valid logic low (L) sequence provided to the first terminal and the second terminal respectively.

13. The method of claim 1, wherein the valid test data and the invalid test data are digital logic signals.

14. The method of claim 1, wherein the valid test data and the invalid test data are analog signals.

15. The method of claim 1, wherein the boundary scan circuitry is compliant with the IEEE 1449.6 boundary scan test standard.

* * * * *